(12) United States Patent
Schäfer et al.

(10) Patent No.: US 10,144,095 B2
(45) Date of Patent: Dec. 4, 2018

(54) SINTER PASTE WITH COATED SILVER OXIDE ON NOBLE AND NON-NOBLE SURFACES THAT ARE DIFFICULT TO SINTER

(71) Applicant: Heraeus Deutschland GmbH & Co. KG, Hanau (DE)

(72) Inventors: Michael Schäfer, Künzell (DE); Wolfgang Schmitt, Rodgau (DE); Susanne Klaudia Duch, Bruchköbel (DE)

(73) Assignee: Heraeus Deutschland GmbH & Co. KG, Hanau (DE)

( * ) Notice: Subject to any disclaimer, the term of this patent is extended or adjusted under 35 U.S.C. 154(b) by 0 days.

(21) Appl. No.: 15/968,712

(22) Filed: May 1, 2018

(65) Prior Publication Data

US 2018/0311774 A1    Nov. 1, 2018

Related U.S. Application Data

(62) Division of application No. 14/784,842, filed as application No. PCT/EP2014/053185 on Feb. 19, 2014.

(30) Foreign Application Priority Data

Apr. 15, 2013 (EP) .................................... 13163776

(51) Int. Cl.
   *B23K 35/36* (2006.01)
   *C01G 3/02* (2006.01)
   (Continued)

(52) U.S. Cl.
   CPC ........ *B23K 35/3601* (2013.01); *B23K 35/025* (2013.01); *C01G 3/02* (2013.01);
   (Continued)

(58) Field of Classification Search
   CPC .... B23K 35/3601; B23K 35/025; C01G 3/02; C01G 5/00; C01G 55/004; H01L 24/83; C09C 3/08; H05K 1/11
   See application file for complete search history.

(56) References Cited

U.S. PATENT DOCUMENTS 7,766,218 B2    8/2010 Yamakawa et al.
2008/0156398 A1    7/2008 Yasuda et al.
(Continued)

FOREIGN PATENT DOCUMENTS

CN    101875158 A    11/2010
CN    102791421 A    11/2012
(Continued)

OTHER PUBLICATIONS

International Search Report dated Apr. 7, 2014 in International Application No. PCT/EP2014/053185.
(Continued)

*Primary Examiner* — John E Uselding
(74) *Attorney, Agent, or Firm* — Panitch Schwarze Belisario & Nadel LLP

(57) ABSTRACT

A mixture contains metal oxide particles that are coated with an organic compound. The organic compound is represented by Formula I:

$$R^1\text{—}COR^2 \qquad (I),$$

wherein $R^1$ is an aliphatic residue having 8 to 32 carbon atoms, wherein $R^2$ is either —OM or comprises the moiety —X—$R^3$, wherein X is selected from the group consisting of O, S, N—$R^4$, wherein $R^4$ is a hydrogen atom or an aliphatic residue, wherein $R^3$ is a hydrogen atom or an aliphatic residue, and wherein M is a cation. The mixture
(Continued)

may be used to connect components and/or to produce a module. A method for producing the mixture is also provided.

14 Claims, 5 Drawing Sheets

(51) Int. Cl.
    *B23K 35/02*      (2006.01)
    *C01G 5/00*      (2006.01)
    *H01L 23/00*      (2006.01)
    *C01G 55/00*      (2006.01)
    *C09C 3/08*      (2006.01)
    *H05K 1/11*      (2006.01)

(52) U.S. Cl.
    CPC .............. *C01G 5/00* (2013.01); *C01G 55/004* (2013.01); *C09C 3/08* (2013.01); *H01L 24/29* (2013.01); *H01L 24/83* (2013.01); *H05K 1/11* (2013.01); *C01P 2004/02* (2013.01); *C01P 2004/04* (2013.01); *C01P 2004/20* (2013.01); *C01P 2004/61* (2013.01); *C01P 2004/62* (2013.01); *C01P 2006/22* (2013.01); *H01L 2224/8384* (2013.01); *H01L 2924/12044* (2013.01); *H01L 2924/1305* (2013.01); *H01L 2924/13055* (2013.01)

(56) References Cited

U.S. PATENT DOCUMENTS

| | | |
|---|---|---|
| 2008/0160183 A1 | 7/2008 | Ide et al. |
| 2010/0270515 A1 | 10/2010 | Yasuda et al. |
| 2012/0055707 A1 | 3/2012 | Schafer et al. |
| 2013/0068290 A1 | 3/2013 | Hang et al. |
| 2013/0161573 A1* | 6/2013 | Torardi .......... H01L 31/022425 252/514 |
| 2013/0216848 A1 | 8/2013 | Kalich et al. |
| 2013/0292168 A1 | 11/2013 | Wolde-Giorgis et al. |

FOREIGN PATENT DOCUMENTS

| | | |
|---|---|---|
| DE | 102010042702 A1 | 4/2012 |
| EP | 2425920 A1 | 3/2012 |
| JP | 2008166086 A | 7/2008 |
| JP | 2009067837 A | 4/2009 |
| JP | 2010257880 A | 11/2010 |
| JP | 2013012706 A | 1/2013 |
| TW | 201245361 A | 11/2012 |
| WO | 2008024625 A1 | 2/2008 |
| WO | 2011026624 A1 | 3/2011 |
| WO | 2012052191 A1 | 4/2012 |

OTHER PUBLICATIONS

Search Report dated Sep. 9, 2013 in EP Application No. 2792642A1.
Written Opinion dated May 4, 2016 in SG Application No. 112015082935.
Huang et al, "A Novel Strategy for Surface Modification of Superparamagnetic Iron Oxide Nanoparticles for Lung Cancer Imaging", Journ. of Materials Chem., vol. 19, pp. 6367-6372 (2009).
Office Action dated Apr. 15, 2016 in TW Application No. 103111302.
Office Action and Search Report dated Jul. 18, 2016 in CN Application No. 201480022024.5.
Office Action dated Nov. 27, 2017 in CN Application No. 201480022024.5.
Office Action dated Dec. 12, 2017 in JP Application No. 2016-508053.
Office Action dated Oct. 30, 2017 in U.S. Appl. No. 14/784,842.
Office Action dated Feb. 22, 2018 in U.S. Appl. No. 14/784,842.

* cited by examiner

SINTER PASTE WITH COATED SILVER OXIDE ON NOBLE AND NON-NOBLE SURFACES THAT ARE DIFFICULT TO SINTER

CROSS-REFERENCE TO RELATED APPLICATIONS

This application is a Divisional of U.S. patent application Ser. No. 14/784,842, filed Oct. 15, 2015, which is a Section 371 of International Application No. PCT/EP2014/053185, filed Feb. 19, 2014, which was published in the German language on Oct. 23, 2014 under International Publication No. WO 2014/170050 A1, and which claims priority under 35 U.S.C. § 119(b) to European Application No. 13163776.1, filed Apr. 15, 2013, the disclosures of which are incorporated herein by reference in their entireties.

BACKGROUND OF THE INVENTION

The present invention relates to a mixture containing metal oxide particles that are coated with an organic compound, and a method for connecting components, in which the mixture is used. The present invention also relates to a module that is produced using the mixture and to a method for producing the mixture described above.

In power electronics, the connecting of components, such as LEDs or very thin silicon chips, comprising high pressure and temperature resistance, is particularly challenging. For this reason, the pressure- and temperature-resistant components are often connected to each other by means of gluing. However, adhesive technology is disadvantageous in that it produces contact sites between the components that comprise only insufficient heat conductivity and/or electrical conductivity. In order to solve this problem, the components to be connected are often subjected to sintering. Sintering technology is a very simple method for stably connecting components, whereby the connecting involves the use of sinter pastes.

U.S. Pat. No. 7,766,218 describes the use of sinter pastes containing silver particles that are coated, at least in part, with fatty acids or fatty acid derivatives, and a volatile dispersion agent in order to improve the sintering and the electrical and thermal conductivity.

International Application Publication No. WO 2011/026624 discloses sinter pastes containing metal particles, metal precursors, solvents, and sintering aids.

According to European Patent No. 2425290, at least one aliphatic hydrocarbon compound is added to the sinter pastes in order to ensure a low sintering temperature.

However, practical application has shown that the sinterability of customary pastes or mixtures is insufficient, in particular at low process pressures, despite the use of various sintering aids. In particular, poor bonding of the sintered sinter material to the surface is a common problem encountered in connecting metallic surfaces by sintering. Accordingly, for example dirt-covered surfaces or aluminum surfaces coated with silver by electroplating, fail to attain the desired bonding of the sinter material to the surface, such that a module that consists of, for example, multiple components connected by means of sinter pastes, fails to show sufficient stability. Aside from stability, the components being poorly connected also has a detrimental effect on their electrical and heat conductivity.

It is therefore an objective of the present invention to provide a mixture, in particular a sinter paste, that allows even surfaces that are difficult to sinter, possibly due to a high degree of contamination, to be connected to each other in a stable and well-bonded manner.

BRIEF SUMMARY OF THE INVENTION

The present invention relates to a mixture containing metal oxide particles that are coated with an organic compound. More particularly, in one aspect, the present invention relates to a mixture containing (a) metal oxide particles and, if applicable, metal particles, whereby the weight ratio of metal particles to metal oxide particles is at most 3 to 2, and (b) an organic compound represented by Formula (I), as follows:

$$R^1\text{—}COR^2 \tag{I}$$

whereby $R^1$ is an aliphatic residue having 8 to 32 carbon atoms, and $R^2$ is either —OM or comprises the moiety —X—$R^3$, whereby X is selected from the group consisting of O, S, N—$R^4$, whereby $R^4$ is a hydrogen atom or an aliphatic residue, $R^3$ is a hydrogen atom or an aliphatic residue, and M is a cation.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
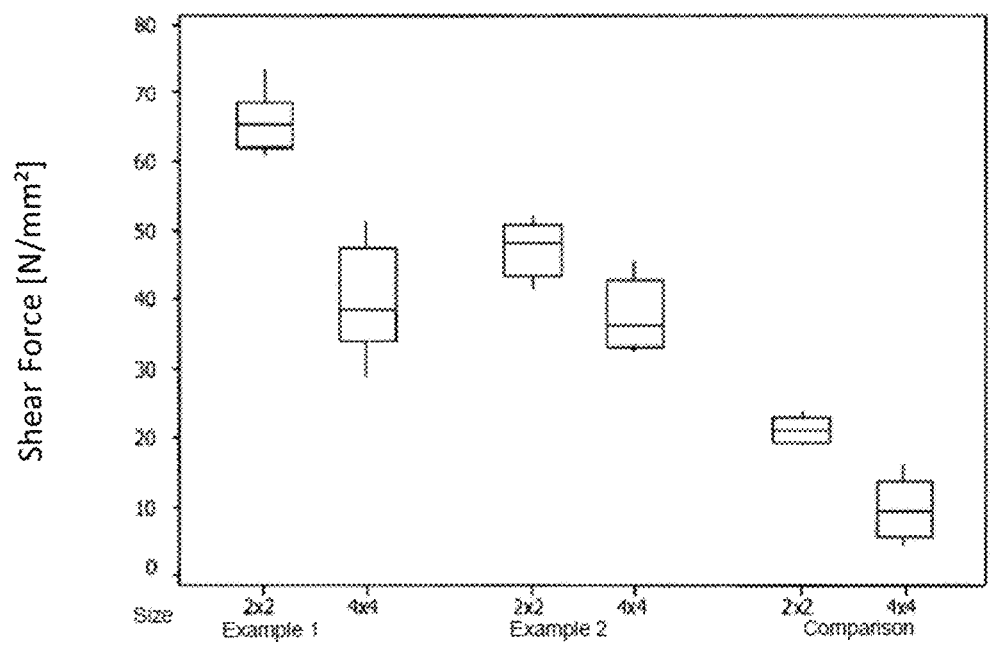
FIG. 1 shows the results of the shear tests, in which measurements were done on the mixtures specified in Table 1.

In one aspect, the present invention relates to a mixture containing (a) metal oxide particles and, if applicable, metal particles, whereby the weight ratio of metal particles to metal oxide particles is at most 3 to 2, and (b) an organic compound represented by Formula (I), as follows:

$$R^1\text{—}COR^2 \qquad (I),$$

whereby $R^1$ is an aliphatic residue having 8 to 32 carbon atoms, and $R^2$ is either —OM or comprises the moiety —X—$R^3$, whereby X is selected from the group consisting of O, S, N—$R^4$, whereby $R^4$ is a hydrogen atom or an aliphatic residue, $R^3$ is a hydrogen atom or an aliphatic residue, and M is a cation.

It has surprisingly been found that mixtures containing metal oxide particles that contain an organic compound (b) and are, in particular, coated with an organic compound (b) comprise excellent bonding to surfaces that cannot be sintered to a sufficient degree by the mixtures disclosed according to the prior art and, in particular, that cannot be sintered to a sufficient degree at the desired low temperatures by prior art mixtures. This includes, as mentioned above, for example, surfaces covered with carbon-containing compounds (i.e. which comprise, for example, a protective layer made of an organic polymer).

Moreover, in one preferred embodiment of the present invention, the metal oxide particles are partially or fully coated with organic compound (b).

In the scope of the present invention, a coating of the particles shall be understood to mean a firmly adhering layer on the surface of the particles. A firmly adhering layer shall be understood to mean that the layer does not detach from the particles simply by the effect of gravity.

The mixture contains metal oxide particles. In the scope of the present invention, metal oxides shall be understood to be compounds of metals and oxygen. Due to the large difference in electronegativity between metal and oxygen, the connection of metal and oxygen is usually of an ionic type or is at least strongly polar. The metal is therefore present as the cation and no longer comprises the typical properties of metal, such as high electrical conductivity and metallic sheen. In the metal oxide particles according to the present invention, oxygen is present not only on the surface of the metal (i.e., these are not metals that are coated by an oxide layer), but rather the oxygen is distributed homogeneously in the compound. The molar ratio of oxygen to metal usually is at least 1:2 in this context.

In a preferred embodiment of the present invention, the metal oxide of the metal oxide particles is selected from the group consisting of copper oxide, silver oxide, and palladium oxide.

In a particularly preferred embodiment, the metal oxide of the metal oxide particles is silver oxide.

The mixture according to the present invention contains metal particles, if applicable. In the scope of the present invention, metals shall be understood to be those chemical elements in the periodic table of the elements that are situated below the separation line from boron to astatine. This includes the elements in the same row as boron, but to the left of boron, in the same row as silicon, but to the left of silicon, in the same row as germanium, but to the left of germanium, and in the same row as antimony, but to the left of antimony, as well as all elements having an atomic number larger than 55. Metals are characterised by their high electrical conductivity, high thermal conductivity, ductility and particular sheen (i.e., the metallic sheen). The metal particles according to the present invention can just as well be particles consisting of multiple phases. Accordingly, the metal particles can, for example, comprise a core made of at least one metallic phase that is coated with at least one further metallic phase. Silver-coated copper particles are an example in this context, as they are included in the definition of metal particles according to the present invention. Moreover, the metal coating can just as well be applied to a non-metallic core.

In an alternative embodiment, the metal particles comprise two or more different metals.

The metal particles in a preferred embodiment comprise or consist of metals selected from the group consisting of copper, silver, and palladium.

In a preferred embodiment, the metal particles are also coated, fully or partially, with organic compound (b).

The mixture according to the present invention contains metal oxide particles and, if applicable, metal particles, whereby the weight ratio of metal particle to metal oxide particle is at most 6:1, preferably at most 4:1, and more preferably at most 3:2. Even more preferably, the weight ratio of metal particle to metal oxide particle is at most 1:1, and in particular at most 2:3, and most preferably at most 1:2, and whereby the metal oxide particles and, if applicable, metal particles, are preferably coated with organic compound (b).

Preferably, the weight ratio of metal particle to metal oxide particle is in a range of 4:1 to 1:10, more preferably of 2:1 to 1:4, even more preferably of 2:1 to 1:2, yet more preferably of 3:2 to 1:9, and most preferably 4:3 to 1:4.

An embodiment in which the weight ratio of metal particles to metal oxide particles is at most 3:2 is particularly preferred.

In a preferred embodiment, the fraction of the mixture accounted for by metal particles is less than 30% by weight, preferably less than 10% by weight, more preferably less than 2% by weight, and most preferably between 0.01% by weight and 2.0% by weight, each relative to the total weight of the mixture.

The ratio of metal oxide particles, in particular metal oxide particles coated with organic compound (b) to metal particles, in particular metal particles coated with compound (b), is preferably selected appropriately such that the sintering properties of the mixture are adapted to the individual requirements of the process at hand. In this context, the ratio is a function of the type of sintering process. It has surprisingly been found that the content of the metal oxide particles, in particular of organic compound (b)-coated metal oxide particles, being as high as possible has an advantageous effect in sintering processes proceeding at elevated pressure. In contrast, in sintering processes at normal pressure, it has been found that admixing metal particles, in particular organic compound (b)-coated metal particles, to the coated metal oxide particles has a beneficial effect on bonding.

The best results in terms of the bonding of the mixture to a surface and the sinterability of the mixture can be attained when the metal of the metal particles and the metal of the metal oxide particles are the same chemical element. Accordingly, a mixture, in which, for example, silver oxide is present together with silver, or copper oxide is present together with copper, or palladium oxide is present together with palladium, is preferred.

Therefore, in one preferred embodiment, the metal of the external layer of the metal particles is selected from the group consisting of copper, silver, and palladium, whereby it is preferred that silver is present together with silver oxide, copper is present together with copper oxide or palladium is present together with palladium oxide.

In another preferred embodiment, the main component of the metals of the metal particle and metal oxide particle is selected from the group consisting of silver, copper, and palladium. Main component shall mean that the metals account for at least 50% by weight, preferably at least 70% by weight, in particular at least 90% by weight, and specifically at least 97% by weight, for example 100% by weight, of the metal particle and/or metal oxide particle, whereby the weight specified refers to the total weight of the metal particle or the total weight of the metal of the metal oxide particle. Preferably, the metal of the metal particle and the metal of the metal oxide are the same material.

The size of the particles in the mixture has an influence on the properties of the mixture, such as its processability or sinterability. In the scope of the invention, the size of the particle shall be understood to mean the average volume-related diameter of the particle.

In an embodiment according to the present invention, the average primary particle size of the metal oxide particles coated with organic compound (b) is between 0.1 and 3.0 μm, preferably between 0.3 and 2.5 μm. In the scope of the present invention, the average primary particle size shall be understood to mean the longest extension of a particle (i.e., the distance between the two ends of the particles that are farthest from each other). For determination of the average primary particle size, scanning electron micrographs of the metal oxide particles according to the present invention were taken at a resolution of 1:1,000 and the particles were measured. The average was calculated from 100 measuring points. It is also preferred for the organic compound (b)-coated metal oxide particles to be present in spherical shape. However, it will be understood by a person skilled in the art that a minor fraction of the particles employed can be non-spherical in shape for production reasons.

Although the coated metal oxide particles show a clearly lesser tendency to agglomerate, agglomeration of the particles causing multiple particles to agglomerate into a larger complex may still occur due to the composition of the mixture and the nature of the metal oxide particles coated with organic compound (b). Preferably, the agglomerates have an average size of up to 50 μm. In the scope of the present invention, the average size shall be understood to mean the maximal extension of an agglomerate (i.e., the distance between the two end points of the agglomerate that are farthest from each other).

The average size of the agglomerates was determined by means of light microscopy images at a resolution of 1:500, which were then used for measurements by optical means. The average was calculated from 100 measuring points. The average size of the agglomerates particularly preferably is between 0.5 and 40 μm.

Preferably, the metal oxide is silver oxide. It has surprisingly been found that a high content of organic compound (b)-coated silver oxide particles significantly improves the sintering properties and the bonding to the surface. In a preferred embodiment, the mixture therefore contains silver oxide in an amount of more than 20% by weight, preferably from 30 to 95% by weight, and more preferably 60 to 90% by weight, each relative to the total weight of the mixture.

The mixture contains an organic compound (b) represented by the following Formula (I):

$$R^1-COR^2 \qquad (I),$$

whereby $R^1$ is an aliphatic residue having 8 to 32 carbon atoms, and $R^2$ is either —OM or comprises the moiety —X—$R^3$, whereby X is selected from the group consisting of O, S, N—$R^4$, whereby $R^4$ is a hydrogen atom or an aliphatic residue, $R^3$ is a hydrogen atom or an aliphatic residue, and M is a cation.

In one embodiment of the present invention, $R^1$ is an aliphatic residue having 8 to 32 carbon atoms, preferably 10 to 24 carbon atoms, and more preferably 12 to 18 carbon atoms, that can be branched or non-branched and, in addition, contain hetero atoms, and $R^2$ is either —OM or comprises the moiety —X—$R^3$, whereby X is selected from the group consisting of O, S, N—$R^4$, whereby $R^4$ is a hydrogen atom or an aliphatic residue, $R^3$ is a hydrogen atom or an aliphatic residue, and M is a cation. It is particularly preferred for X to be oxygen (O) and, in particular, $R^3$=H.

Preferably $R^3$ and/or $R^4$ is/are an aliphatic residue having 1 to 32, more preferably 10 to 24, and most preferably 12 to 18, carbon atoms, whereby the residue can be linear or branched and, if applicable, can, in addition, comprise hetero atoms.

Organic compound (b) is preferably a compound selected from the group consisting of fatty acids (X=O and $R^3$=H), fatty acid salts (M=cation), and fatty acid esters.

The free fatty acids, fatty acid salts, and fatty acid esters preferably are non-branched.

Moreover, the free fatty acids, fatty acid salts, and fatty acid esters are preferably saturated.

According to a preferred embodiment, the organic compound is fatty mono-acids, salts of fatty mono-acids or fatty mono-acid esters.

In a preferred embodiment, organic compound (b) is a $C_8$-$C_{30}$ fatty acid, preferably a $C_8$-$C_{24}$ fatty acid, and more preferably a $C_{12}$-$C_{18}$ fatty acid or a derivative thereof.

Conceivable fatty acid salts are preferably salts whose anionic component is the deprotonated fatty acid and whose cationic component M is selected from the group consisting of ammonium ions, monoalkylammonium ions, dialkylammonium ions, trialkylammonium ions, lithium ions, sodium ions, potassium ions, copper ions, and aluminium ions.

Preferred fatty acid esters are derived from the corresponding fatty acids, whereby methyl, ethyl, propyl or butyl esters are preferred.

According to a preferred embodiment, the organic compound is selected from the group consisting of caprylic acid (octanoic acid), capric acid (decanoic acid), lauric acid (dodecanoic acid), myristic acid (tetradecanoic acid), palmitic acid (hexadecanoic acid), stearic acid (octadecanoic acid), mixtures thereof, as well as the corresponding esters and salts, and mixtures thereof.

According to a particularly preferred embodiment, the organic compound is selected from the group consisting of lauric acid (dodecanoic acid), stearic acid (octadecanoic acid), sodium stearate, potassium stearate, aluminium stearate, copper stearate, sodium palmitate, and potassium palmitate and any mixtures thereof.

Moreover, organic compound (b) is preferably selected from the group consisting of octanoic acid, stearic acid, lauric acid, palmitic acid, and any mixtures thereof.

For example, a mixture of lauric acid and stearic acid is a particularly preferred mixture. A mixture, in which lauric acid and stearic acid are present at a weight ratio of 25 to 75, is preferred.

Preferably, the metal oxide particles are fully or partly coated with organic compound (b). It has been found that the coated metal oxide particles and/or metal particles, if applicable, in particular when they are coated with fatty acids, agglomerate less strongly, thus making it possible to largely prevent the metal oxide particles and metal particles, if applicable, from clumping at an early stage during the sintering process.

According to a preferred embodiment, the mixture contains 0.3 to 6.0% by weight, preferably 0.5 to 4.0% by weight, and most preferably 0.8 to 2.5% by weight of organic compound (b), each relative to the total weight of the mixture.

In a preferred embodiment of the present invention, the mixture is a paste that comprises a dispersing agent (c).

In the scope of the invention, dispersing agent (c) shall be understood to mean substances that can dissolve or disperse other substances through physical processes.

According to the present invention, the common dispersing agents used for sinter pastes are conceivable as dispersing agent (c). Preferably, organic compounds having at least one hetero atom and 6 to 24 carbon atoms, more preferably 8 to 20 carbon atoms, and most preferably 8 to 14 carbon atoms, are used as dispersing agent.

The organic compounds can be branched or non-branched. Cyclic compounds, in particular cyclic and unsaturated compounds, preferably constitute the dispersing agent (c).

Moreover, the organic compounds that are used as the dispersing agent (c) can be saturated, mono-unsaturated or multi-unsaturated compounds.

The at least one hetero atom contained in the organic compounds that can serve as the dispersing agent (c) is preferably selected from the group consisting of oxygen atoms and nitrogen atoms.

The at least one hetero atom can be part of at least one functional group. According to a particularly preferred embodiment, the dispersing agent (c) used is an alcohol.

Monocyclic mono-terpene alcohols, such as for example terpineol, in particular α-Terpineol, are specifically preferred.

It is particularly preferred for the boiling point of the dispersing agent (c) to be below the temperature used for sintering the pastes. It is specifically preferred for the boiling temperature of the dispersing agent (c) to be below 240° C., more preferably below 230° C., in particular below 220° C.

In a preferred embodiment, dispersing agent (c) is selected from the group consisting of alpha-terpineol, beta-terpineol, gamma-terpineol, delta-terpineol, mixtures of the preceding terpineols, N-methyl-2-pyrrolidone, ethylene glycol, dimethylacetamide, 1-tridecanol, 2-tridecanol, 3-tridecanol, 4-tridecanol, 5-tridecanol, 6-tridecanol, isotridecanol, dibasic esters, preferably dimethylesters of glutaric, adipinic or succinic acid or mixtures thereof, glycerol, diethylene glycol, triethylene glycol or mixture thereof.

According to a preferred embodiment, it is preferred to use aliphatic hydrocarbon compounds as the dispersing agent (c). In this context, the aliphatic hydrocarbons can consist of saturated compounds, singly or multiply unsaturated compounds and mixtures thereof. Preferably, the aliphatic hydrocarbon compounds consist of saturated hydrocarbon compounds, whereby these can be cyclic or acyclic, such as, for example, n-alkanes, isoalkanes, cycloalkanes or mixtures thereof. The aliphatic hydrocarbon compounds can, for example, be represented by the formulas $C_nH_{2n+2}$, $C_nH_{2n}$, and $C_nH_{2n-2}$, whereby n is an integer between 5 and 32. In a particularly preferred embodiment, the aliphatic hydrocarbon compounds that can be used as dispersing agent (c) are selected from the group consisting of hexadecane, octadecane, isohexadecanes, isooctadecanes, cyclohexadecanes, and cyclooctadecanes.

Dispersing agent (c) differs from organic compound (b). In particular, dispersing agent (c) is not an organic compound included in the definition of organic compound (b).

The dispersing agent (c) is usually present in an amount of 6 to 40% by weight, preferably 8 to 25% by weight, specifically 10 to 20% by weight, each relative to the total weight of the mixture according to the invention.

The type and amount of the dispersing agent (c) can be used to adjust the flow properties of the sinter pastes. Sinter pastes are preferably applied to the sintered components by printing methods.

It has surprisingly been found that the mixture according to the invention can be applied particularly evenly in a printing method and thus produces a smooth surface. Using the mixture according to the present invention allows a particularly even layer to be produced that comprises none of the upheavals on the sides that are common upon use of conventional sinter pastes.

It has also surprisingly been found that the addition of organic polymers comprising oxygen atoms further increases the sinterability.

Therefore, in one embodiment, the mixture according to the present invention comprises a polymer comprising oxygen atoms. A polymer, in which the oxygen present is bound as ether and/or hydroxide, is particularly preferred. Also preferred is a polymer that comprises alkoxylate groups, in particular ethoxylate and/or methoxylate groups.

For example, polysaccharides, such as celluloses, which are preferably chemically modified, for example which have been alkoxylated or alkylcarboxylated, are suitable polymers.

Cellulose derivatives, for example etherified cellulose, have proven to be particularly well-suited polymers. The cellulose derivatives preferably comprise a degree of substitution of 2.0 to 2.9, and more preferably between 2.2 and 2.8. The degree of substitution indicates the average number of chemically modified, in particular etherified, hydroxyl groups per glucose unit. Ethyl cellulose is specifically preferred. Preferably, the cellulose derivative has an ethoxy content of 43.0% to 53.0%, particularly preferably of 47.5% to 50%, in particular of 48.0% to 49.5%, each relative to the number of hydroxyl groups, whereby the ethoxy content of a fully substituted derivative would be 54.88%. Preferably, the viscosity of the cellulose derivative is 60 to 120 cps, more preferably 90 to 115 cps, particularly preferably 85 to 110 cps. In this context, the viscosity was determined according to ASTM D914 in a mixture consisting of 80% by weight toluene and 20% by weight ethanol using a Hercules Horizontal Capillary Viscosimeter at 25° C.

Preferably, the polymer is selected from the group consisting of methylcellulose, ethylcellulose, ethylmethylcellulose, carboxycellulose, hydroxypropylcellulose, hydroxyethylcellulose, hydroxymethylcellulose or mixtures thereof.

Presumably, ethylcellulose improves the sinterability of the paste even more through optimized conversion of the organic compound to carbon monoxide.

Preferably, the mixture according to the present invention contains 0.05 to 2.0% by weight, more preferably 0.1 to 0.8% by weight, and particularly preferably 0.2 to 0.5% by weight of the oxygen-containing polymer, in particular of the cellulose derivative, whereby the weight specified relates to the total weight of the mixture in each case.

Moreover, the mixture according to the present invention may further contain ingredients, such as customary surfactants, de-foaming agents, binding agents or viscosity-controlling agents. Preferably, the mixtures may contain wetting agents.

The further ingredients are usually added in an amount of up to 0.01% by weight, preferably from 0.001 to 0.01% by weight, each relative to the total weight of the mixture according to the invention.

Preferably, the mixture according to the present invention comprises essentially no glass, in particular no glass frit. Lead oxide, bismuth oxide, alkali and alkaline earth oxide, tellurium oxide and the like are typical ingredients of a glass frit.

In this context, the term, essentially, is to mean that the fraction of glass in the mixture preferably is less than 2% by weight, more preferably less than 1% by weight, specifically less than 0.1% by weight, for example 0% by weight, whereby the weights are specified relative to the total weight of the mixture in each case.

Therefore, according to one embodiment of the present invention, the fraction of glass in the mixture is less than 2% by weight, preferably less than 0.5% by weight, in particular 0.0 to 0.3% by weight, each relative to the total weight of the mixture.

The present invention also relates to a method for connecting a component or module to a substrate through the use of the mixture.

According to the present invention, the method for connecting a component having a first surface to a substrate having at least a second surface comprises the following steps:
  a) contacting the component via the first surface to the substrate via at least a second surface by the mixture according to the present invention, whereby the mixture is situated between the first surface of the component and the second surface of the substrate, to obtain a structure, and
  b) heating the structure.

Preferably, steps a) and b) are repeated multiple times until the desired structure is attained. Accordingly, modules can be produced through successive and/or synchronous connection of multiple identical or different components.

According to the present invention, connecting at least one component on a substrate shall be understood to mean affixing a component to the surface of a substrate. In this context, "to" simply means that a surface of the first component is connected to a surface of the substrate regardless of the relative disposition of the two surfaces or of the arrangement containing the surfaces to be connected.

A component in the scope of the present invention can either be a single part that cannot be taken apart further or it can comprise more than one part, whereby the parts preferably cannot be taken apart further. In the scope of the present invention, the term "component" also comprises modules that may be connected to each other.

In a preferred embodiment of the method according to the present invention, the component is contacted by one of its surfaces to a surface of the substrate, whereby the contacting involves the mixture according to the present invention. In this context, both the substrate and the component can comprise more than one surface. It is preferable to provide an arrangement in which the mixture according to the present invention is situated between the surface of the component and the surface of the substrate.

According to the present method, multiple components and substrates may be connected to each other just as well. For example, one substrate and two components, component 1 and component 2, may be connected to each other appropriately, such that the substrate and component 1, as well as component 1 and component 2, are being connected. In this context, the mixture according to the present invention is preferably situated between the substrate and component 1, as well as between component 1 and component 2. The present invention provides the substrate and the individual components in a sandwiched structure and the present invention provides for them to be connected to each other.

In the scope of the present invention, a sandwiched arrangement shall be understood to mean an arrangement, in which the surfaces of two components or of one component and one substrate are situated one above the other and are arranged essentially parallel to each other.

The arrangement of at least one component, one substrate and one mixture, whereby the mixture is situated between one component and one substrate of the arrangement, can be produced according to any method known from the prior art.

Preferably, at least one surface of a substrate is first provided with the mixture according to the present invention. Then, one component is placed by one of its surfaces on the mixture that has been applied to the surface of the substrate.

The application of the mixture to the surface of a substrate or component may be effected through any conventional method.

Preferably, the mixture is applied by printing methods, for example by screen printing or stencil printing. However, the mixture can be applied just as well by dispensing technology, spraying technology, jet technology, pin transfer or immersion.

Following the application of the mixture, it is preferable to contact, by the mixture, the surface of the component or substrate that has been provided with the mixture to a surface of the component to be connected thereto. Accordingly, a layer of the mixture is situated between the components to be connected.

In the scope of the present invention, substrate shall be understood to mean a support or base. Components, for example, can be affixed to the support. According to the scope of the present invention, a substrate may, for example, be a support to which semiconductor chips are connected for contacting of their connectors, for example a printed circuit board. Moreover, according to the scope of the present invention, a substrate shall be understood to mean a structure made up of multiple components that serves as a support for further components.

In a preferred embodiment of the method according to the present invention, at least one of the surfaces contains at least one metal selected from the group consisting of copper, nickel, gold, aluminium, and silver.

In a particularly preferred embodiment, the metal of the at least one surface is silver.

An embodiment, in which the at least one surface comprises or consists of at least one metal selected from the group consisting of nickel and aluminium, is particularly preferred.

In a preferred embodiment of the method, the fraction of the volume formed by the product of the at least one surface and a depth of 1 μm accounted for by the at least one metal is at least 50% by weight, preferably at least 90% by weight, in particular 100% by weight, each relative to the total weight of the metals in the volume.

In a further preferred embodiment, at least one of the surfaces effecting the contacting is covered fully or partly by a carbon-containing compound. It is particularly preferred for the carbon-containing compound to be a polymer. This may concern carbon-containing contaminants that may have become deposited on the surface during earlier process steps. It has surprisingly been found that the use of the mixture according to the present invention allows even the surfaces comprising carbon-containing contaminants to be connected with good bonding. Using a mixture according to the prior art, it was not feasible to attain bonding on the surfaces, and the surfaces first needed to be cleaned to be free of the carbon-containing contaminant before they could be connected to each other. The cleaning step is dispensable if the mixture according to the present invention is used, which not only accelerates the process, but is also economically beneficial.

In a preferred embodiment, a drying step follows after application of the mixture to the surface.

Preferably, drying is understood to mean reducing the dispersing agent fraction in the mixture.

The drying can proceed either after producing the arrangement (i.e., after contacting the components or component and substrate to be connected) or right after the application of the mixture to at least one of the surfaces of the component or substrate and before contacting to the element to be connected.

Preferably, the drying temperature is in a range of 50-160° C.

Obviously, the drying time depends on the specific composition of the mixture and the size of the arrangement to be sintered. Common drying times are in the range of 5-45 minutes.

Preferably, the drying proceeds in a nitrogen atmosphere. It is particularly preferable for the nitrogen atmosphere to have an oxygen content of less than 50 ppm, preferably of less than 20 ppm, more preferably of less than 5 ppm, whereby the ppm values relate to parts by mass.

According to the method according to the present invention, the structure obtained in step a) is heated. Preferably, the heating is a sintering.

The mixture according to the present invention may be sintered. Sintering shall preferably be understood to mean connecting one or more components and a substrate or connecting two or more components by heating while bypassing the liquid phase. Accordingly, the sintering proceeds as a diffusion process.

Preferably, the sintering proceeds after the surfaces of the component and substrate have been contacted by the mixture. After the sintering, the component or the substrate can be connected to a further component. In a preferred embodiment, the sintering proceeds after the finished structure is produced. Preferably, more than one contact site is sintered simultaneously.

The heating of the structure preferably proceeds appropriately such that an electrically conductive and heat conductive connection is produced between the surface of the component and the surface of the substrate, as well as between the surfaces of the components. Moreover, it is preferred to heat appropriately such that a mechanically stable connection is produced.

Preferably, the heating proceeds at temperatures between 150° C. and 300° C., more preferably between 200° C. and 250° C. It has surprisingly been found that the use of the mixtures according to the present invention allows the heating to proceed at lower temperatures than generally required according to the prior art.

In this context, the process pressure is preferably in the range of 30 MPa or less and 0 MPa or more, and more preferably in the range of 5 MPa or more and 25 MPa or less.

In the scope of the present invention, process pressure shall be understood to be the pressure that is being applied to the sample in addition to the atmospheric pressure. Accordingly, heating at a process pressure of 0 MPa means that the heating proceeds without applying any additional pressure (i.e., at atmospheric pressure).

However, the heating can also proceed without applying any process pressure (i.e., at a process pressure of 0 MPa). The time is a function of the process pressure and is preferably in the range of 2 to 60 minutes.

The heating can proceed in an atmosphere that is not subject to any limitations. However, preferably the heating is carried out in an atmosphere that contains oxygen.

The heating is carried out in a conventional suitable facility, in which, preferably, the aforementioned process parameters can be set.

It has surprisingly been found for the process of sintering at additional pressure that having a higher fraction of metal oxide in the mixture leads to better bonding. In a preferred embodiment of the method according to the present invention, the mixture therefore comprises 60 to 95% by weight metal oxide particles, in particular silver oxide particles, which are preferably coated with organic compound (b), and the heating, preferably the sintering, of the structure proceeds at a process pressure of 5 to 20 MPa, preferably at 7 to 15 MPa. In this context, the quantity of metal oxide particles specified relates to the total weight of the mixture.

Moreover, it has surprisingly been found that for processes proceeding at atmospheric pressure (i.e. approximately 101325 Pa), the bonding effect can be positively increased by admixing metal particles, mainly metal particles coated with organic compound (b). Therefore, in a preferred embodiment of the method according to the present invention, the mixture comprises 10 to 30% by weight metal particles, in particular silver particles, which are preferably coated with organic compound (b), and the heating, preferably the sintering, of the structure proceeds at a process pressure in the range of 0 MPa to 3 MPa, preferably in the range of 1 MPa to 2.5 MPa. The quantity of metal particles specified relates to the total weight of the mixture.

It has surprisingly been found that the method according to the present invention is particularly well-suited for the connecting of surfaces, in which at least one surface comprises a non-noble metal, preferably selected from the group consisting of copper, aluminium, and nickel. Therefore, in a preferred embodiment of the method according to the present invention, at least one of the contact surfaces (i.e., either the first surface and/or the second surface) is a non-noble metal, in particular copper or aluminium or nickel, and the mixture according to the present invention comprises a weight ratio of metal particles to metal oxide particles of 0 to 6:1, preferably of 1:8 to 4:1.

Alternatively, in a preferred embodiment of the method according to the present invention, both contact surfaces (i.e., the first and the second surface) are noble metals, in particular noble metals selected from the group consisting of silver, gold, palladium, and platinum, and the mixture according to the present invention comprises a weight ratio of metal particles to metal oxide particles of 1:8 to 4:1, preferably of 1:4 to 2:1.

In a specific embodiment, the first and/or the second surface is a silver surface and the mixture according to the present invention comprises a weight ratio of silver particles to silver oxide particles of 1:7 to 5:3.

The present invention also relates to a module comprising (i) an electronic component having a first surface, (ii) a substrate having at least one second surface, and (iii) a mixture according to the present invention that directly contacts the first surface and the second surface.

In a preferred embodiment, the mixture according to the present invention is sintered.

In a preferred embodiment, at least one of the surfaces is selected from the group consisting of copper, silver, gold, nickel, and aluminum. In a preferred embodiment, at least one of the surfaces is selected from the group consisting of nickel and aluminum.

In a preferred embodiment, at least one of the surfaces is fully or partly covered with a carbon-containing compound, whereby the carbon-containing compound is to be seen to be part of the surface and thus contacts the mixture according to the present invention. The carbon-containing compound may be, for example, a coating of the surface with, for example, a polymer. Moreover, the carbon-containing compound may result from contaminants that became deposited on the surface due to particularities of the process.

According to the present invention, the module comprises a substrate and one or more components. Preferably, the term "components" is used to denote parts that are used in high-performance electronics. Preferably, the module comprises electronic and/or passive components.

The components may be, for example, diodes, LEDs (light-emitting diodes, lichtemittierende Dioden), DCB (direct copper bonded) substrates, leadframes, dies, IGBTs (insulated-gate bipolar transistors, Bipolartransistoren mit isolierter Gate-Elektrode), ICs (integrated circuits, integrierte Schaltungen), sensors, heat sink elements (preferably aluminium heat sink elements or copper heat sink elements) or other passive components (such as resistors, capacitors or coils). Preferably, the components may just as well be non-metallic components.

The components to be connected may be identical or different components.

Preferred embodiments of the present invention relate to the connecting of an LED to a leadframe; an LED to a ceramic substrate; dies, diodes, IGBTs or ICs to leadframes, ceramic substrates or DCB substrates; sensors to a leadframe or a ceramic substrate; a DCB or ceramic substrate to copper or aluminum heat sink elements; a leadframe to a heat sink element; or tantalum capacitors, preferably in an un-housed condition, to a leadframe.

It is also preferred to connect more than two components to each other. For example, (i) an LED or chip may be connected to (ii) a leadframe and (iii) a heat sink element, whereby the leadframe preferably is situated between (i) the LED or chip and (iii) the heat sink element.

Similarly, a diode may be connected to two heat sink elements, whereby the diode preferably is situated between the two heat sink elements.

The present invention also relates to a method for producing the mixture according to the present invention, whereby the metal oxide particles and, if applicable, the metal particles are being mixed with organic compound (b).

The mixing preferably proceeds such that the metal oxide particles and, if applicable, the metal particles are coated with organic compound (b) to the fullest extent possible. Preferably, the mixing of the metal oxide particles and, if applicable, the metal particles with organic compound (b) proceeds in that organic compound (b) is slurried in solvents and is milled together with the metal oxide particles, if applicable, and metal particles in disintegration devices, in particular in bead mills. Subsequently, the coated metal oxide particles and, if applicable, the coated metal particles may be dried and the dust may be removed, if applicable, in a further step.

In a preferred embodiment, the mixing proceeds by jet milling. In this context, the metal oxide particles, the metal particles, if applicable, and organic compound (b) are bombarded onto each other by nozzles. The impact breaks up possible aggregates and attains a particularly advantageous coating of the metal oxide particles and, if applicable, metal particles.

The mixture according to the present invention may be produced in mixing apparatus and stirrers familiar to a person skilled in the art. In a preferred refinement of the production method according to the present invention, the metal oxide particles and, if applicable, metal particles are coated with organic compound (b) in a first step.

In a subsequent step, the coated particles are mixed with a dispersing agent (c), if applicable, to form a sinterable paste.

In an alternative embodiment, the metal oxide particles and, if applicable, the metal particles may be dispersed with a dispersing agent (c) and then organic compound (b) is added.

The present invention is illustrated in more detail by the following examples, though the examples shall not be construed as to limit the scope of the present invention.

EXAMPLES

Production of the Mixtures

Initially, the mixtures according to the present invention were produced by mixing the ingredients at the quantitative ratios given in Table 1.

The coating of the coated silver oxide particles accounted for 0.8% by weight of the total weight of the coated silver oxide particles.

A mixture of stearic acid and lauric acid at a mass ratio of 75 to 25 (stearic acid:lauric acid) was used as the coating.

Silver oxide particles having a primary particle size of 1 μm, as determined by means of scanning electron microscopy, were used as metal oxide particles. α-Terpineol was used as a dispersing agent.

TABLE 1

|  | Example 1 | Example 2 | Reference Example |
|---|---|---|---|
| α-Terpineol | 15.72 | 20.466 | 17.447 |
| Ethylcellulose N100 | 0.56 | 0.776 | 0.516 |
| Silver oxide-coated[1] | 83.72 | — | — |
| Silver oxide-coated[2] | — | 78.758 | — |
| Not silver oxide-coated[3] | — | — | 82.037 |
| Total | 100 | 100 | 100 |

[1] The coating was done by jet milling. The agglomerates of the coated silver oxide particles had an average size of 3 μm as determined by means of light microscopy methods.
[2] The silver oxide particles were coated by slurrying the particles in an alcoholic solution of the fatty acid mixture specified above and subsequent drying of the particles. The agglomerates of the coated particles had an average size of 20 μm as determined by means of light microscopy.
[3] The agglomerates had an average size of 30 μm as determined by means of light microscopy methods.

The mixture was applied to the respective surface by stencil printing. A stainless steel stencil was used as stencil. The doctor blade angle was 60° and the printing rate was 50 mm/s. Silver DCBs and copper DCBs were used as surfaces.

The sintering proceeded either under pressure or with no pressure being applied.

a) Pressure Sintering

Pressure sintering involved the application of the mixture to the surface of a DCB substrate. Subsequently, the mixture according to the present invention was contacted to a component comprising a silver surface or a copper surface, and sintered for 3 minutes at 10 MPa and 230° C.

b) Pressure-Free Sintering (with No Additional Process Pressure)

Pressure-free sintering involved the application of the mixture to the surface of a DCB substrate. Subsequently, the mixture was contacted to a component comprising a silver surface or a copper surface.

The following heating profile was used in pressure-free sintering:

The contact site was heated steadily to 165° C. over the course of 30 minutes and then maintained at 165° C. for 20 minutes. Subsequently, the temperature was increased steadily to 230° C. over the course of 5 minutes and then maintained at this temperature for 60 minutes. Then, this was cooled steadily to 30° C. over the course of 50 minutes.

Moreover, mixtures were prepared that contained not only coated silver oxide particles, but coated silver particles as well. In this context, the silver particles, much like the silver oxide particles, were coated with a mixture of 75% stearic acid and 25% lauric acid. Analogous to the silver oxide particles, the coating accounted for 0.8% by weight relative to the weight of the coated silver particles. Two grades of silver particles differing in D50 value were used. One type of particle had a D50 value of 4 μm, whereas the other particles had a D50 value of 5.4 μm, whereby the D50 value was determined by means of laser diffraction in accordance with DIN ISO 13320. The particles were present as flakes in each case. The production of the mixture proceeded analogous to the process described above. The composition is shown in Table 2. The numbers in Table 2 are weights.

jet milling of the mixture of stearic acid and lauric acid, showed the best bonding (Example 1). Silver oxide particles coated by slurrying the particles in an alcoholic solution of the fatty acids and subsequent drying of the particles (Example 2) showed somewhat reduced bonding, but still more than the reference example though, in which uncoated silver oxide particles were used (Reference Example).

Figure 2:
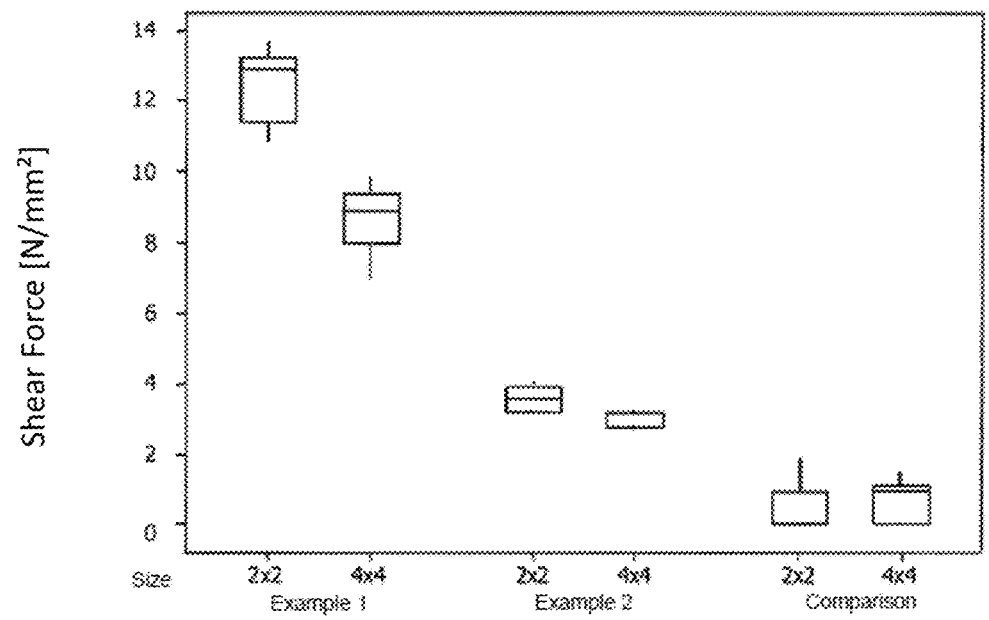
FIG. 2 shows the results of the shear test of the mixture specified in Table 1 that had been used to connect a silver surface sized 2×2 mm and a silver surface sized 4×4 mm to the surface of a DCB substrate by pressure-free sintering.

FIG. 2 shows the results of the shear test of the mixture specified in Table 1 that had been used to connect a silver surface sized 2×2 mm and a silver surface sized 4×4 mm to the surface of a DCB substrate by pressure-free sintering. The profile described above was used in the pressure-free sintering. As before, the mixture according to the present invention, in which the silver oxide particles were coated with organic compound (b) by jet milling, showed the best bonding (Example 1). Somewhat poorer bonding, but still better than with the uncoated silver oxide particles, was shown by those not coated by jet milling (Example 2).

Figure 3:
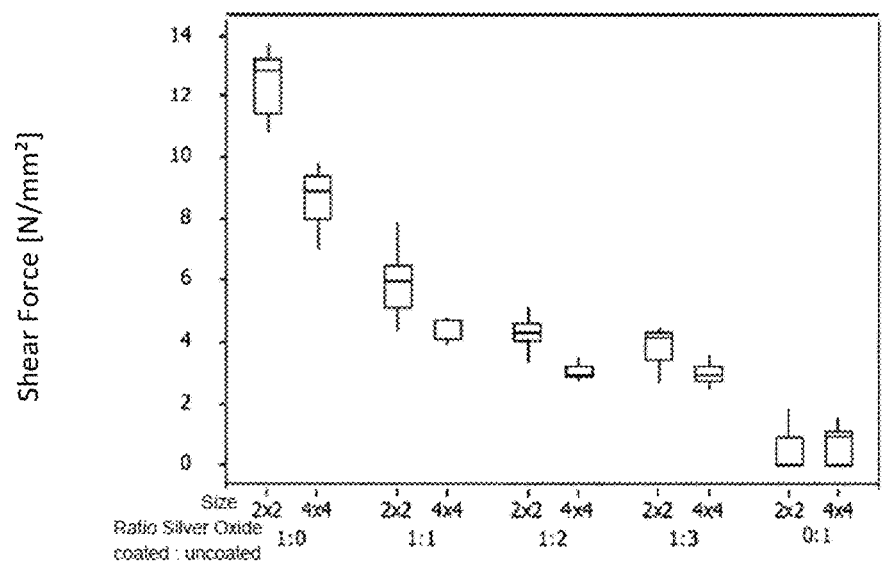
FIG. 3 shows the results of the shear tests, in which various amounts of uncoated silver oxide particles were added to the mixture according to the present invention.

FIG. 3 shows the results of the shear tests, in which various amounts of uncoated silver oxide particles (Reference Example) were added to the mixture according to the present invention (Example 1). The ratios of coated silver oxide particles to uncoated silver oxide particles are specified as weight ratios. The mixtures were used as the connection between silver surfaces sized 2×2 mm and 4×4 mm and the surface of a DCB substrate, whereby the sintering proceeded as pressure-free sintering. As is evident from FIG. 3, the bonding of the mixture decreases with increasing fraction of uncoated silver oxide particles.

TABLE 2

|  | Example 1 | Example 3 | Example 4 | Example 5 | Example 6 | Example 7 | Example 8 | Example 9 | See Example 10 |
|---|---|---|---|---|---|---|---|---|---|
| Fraction of silver particles | 0% | 10% | 20% | 30% | 40% | 50% | 60% | 70% | 76% |
| α-Terpineol | 15.72 | 15.72 | 15.72 | 15.72 | 15.72 | 15.72 | 15.72 | 15.72 | 11.35 |
| Ethylcellulose N100 | 0.56 | 0.56 | 0.56 | 0.56 | 0.56 | 0.56 | 0.56 | 0.56 | 0.35 |
| Silver oxide coated* | 83.72 | 73.72 | 63.72 | 53.72 | 43.72 | 33.72 | 23.72 | 13.72 | 12.3 |
| Silver particles** D50 = 4.0 μm | — | 5 | 10 | 15 | 20 | 25 | 30 | 35 | 38 |
| Silver particles** D50 = 5.4 μm | — | 5 | 10 | 15 | 20 | 25 | 30 | 35 | 38 |
| Total | 100 | 100 | 100 | 100 | 100 | 100 | 100 | 100 | 100 |

*Coating was done by jet milling. The coating accounted for 0.8% by weight relative to the weight of the coated silver oxide (coating agent:stearic acid:lauric acid at a weight ratio of 75:25).
**The silver particles are coated with a mixture of stearic acid and lauric acid (weight ratio of stearic acid to lauric acid 75:25), whereby the coating accounted for 0.8% by weight.

The mixture was applied to a metal surface and sintered. Silver surfaces and copper surfaces were used as metal surfaces. After the sintering, the bonding was determined by testing the shear strength. In this context, the components were sheared off with a shearing chisel at a rate of 0.3 mm/s at 20° C. The force was measured by means of a load cell (DAGE 2000 device made by DAGE, Germany).

Figure 4:
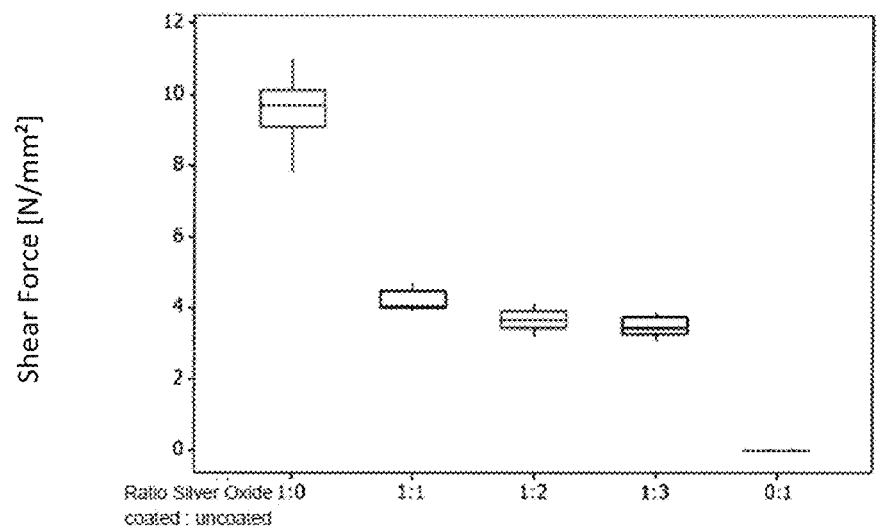
FIG. 4 shows the test results of the shear tests, in which increasing amounts of uncoated silver oxide particles were added to the mixture according to the present invention.

FIG. 1 shows the results of the shear tests, in which measurements were done on the mixtures specified in Table 1. The sintering proceeded under pressure according to the conditions specified above. Silver surfaces sized 2×2 mm and 4×4 mm that had been applied onto the surface of a DCB substrate by the mixture according to the present invention were used as metal surface. As is evident from FIG. 1, the samples, in which the silver oxide particles were coated by FIG. 4 shows the test results of the shear tests, in which increasing amounts of uncoated silver oxide particles (Reference Example) were added to the mixture according to the present invention (Example 1). The ratios of coated silver oxide particles to uncoated silver oxide particles are specified as weight ratios. The mixture was used to connect a copper surface sized 4×4 to the surface of a DCB substrate. The sintering proceeded as pressure-free sintering. As before, the mixture according to the present invention showed the best bonding to the surface. It has surprisingly been found that the coated silver oxide particles can be used to attain a very good bonding effect, although the risk of strong oxidation of the copper surface would have been expected.

Figure 5A:
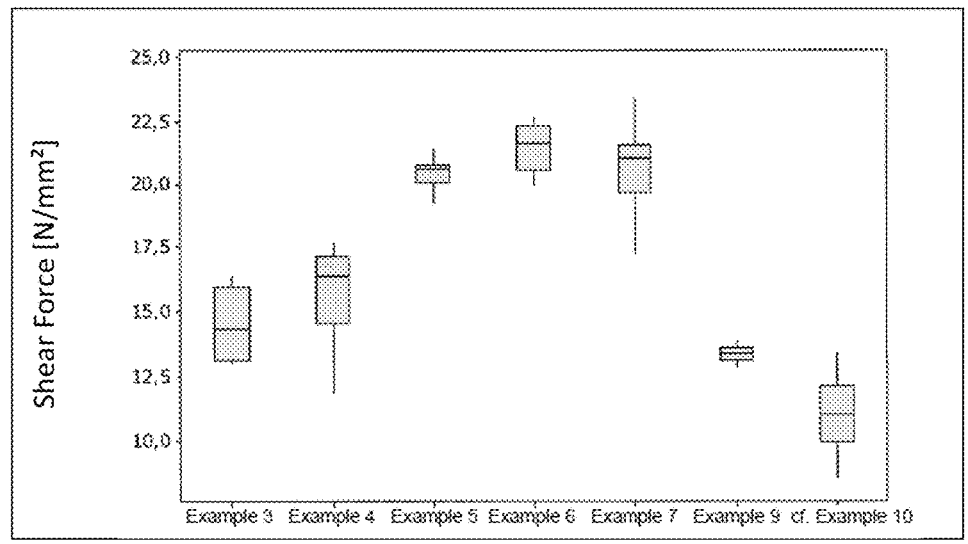
FIG. 5A shows the results of the shear tests of the mixtures shown in Table 2, wherein the mixtures were used as the connections between a silver surface sized 2×2 mm and the surface of a DCB substrate.

FIG. 5A shows the results of the shear tests of the mixtures shown in Table 2 (Examples 3 to 7, Example 9 and Reference Example 10). Here, mixtures comprising different ratios of coated silver oxide particles to coated silver particles were used. The ratios of coated silver oxide particles to coated silver particles are specified as weight ratios. Both the silver oxide particles and the silver particles were coated with a mixture of stearic acid and lauric acid at a mass ratio of 75 to 25 (0.8% by weight, relative to coated particles). The sintering proceeded as pressure-free sintering. The mixtures were used as the connections between a silver surface sized 2×2 mm and the surface of a DCB substrate. As is evident from FIG. 5A, the bonding effect in pressure-free sintering is largest if up to 50% by weight coated silver particles were added to the coated silver oxide particles. If the fraction of coated silver particles increases even more, the bonding decreases (Reference Example 10).

Figure 5B:
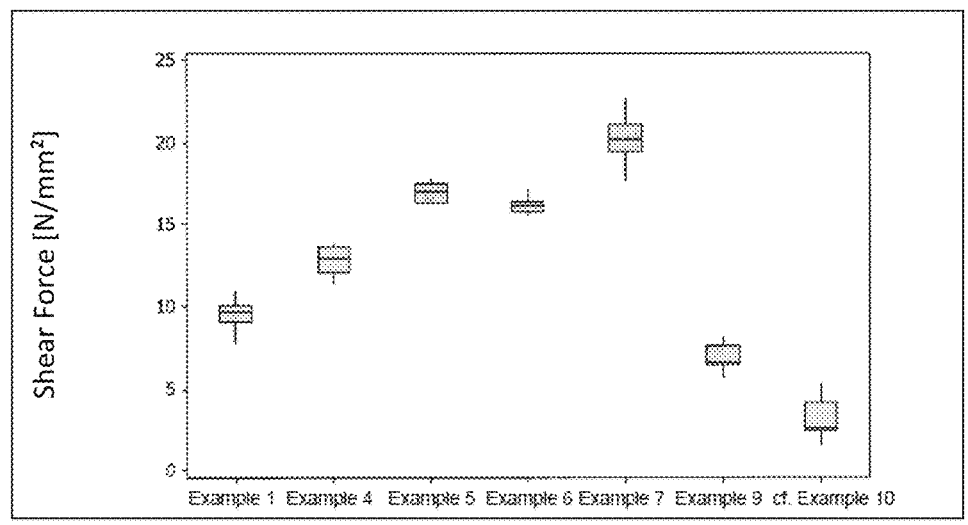
FIG. 5B shows the results of the shear tests of the mixtures shown in Table 2, wherein the mixtures were used as the connections between a copper surface sized 2×2 mm and a DCB surface.

FIG. 5B shows the results of the shear tests of the mixtures shown in Table 2 (Example 1, Examples 4 to 7, Example 9 and Reference example 10), whereby the mixtures were used as the connection between a copper surface sized 2×2 mm and a DCB surface. The ratios of coated silver oxide particles to coated silver particles are specified as weight ratios. Both the silver oxide particles and the silver particles were coated with a mixture of stearic acid and lauric acid at a mass ratio of 75 to 25 (0.8% by weight, relative to coated particles). The sintering proceeded as pressure-free sintering. As is evident from FIG. 5B, adding coated silver particles to the mixture according to the present invention improved the bonding to a copper surface in pressure-free sintering. However, if the fraction of uncoated silver particles exceeds a certain level, the bonding decreases again. Using the mixture specified in Reference Example 10, in which the fraction of coated silver particles was 76% of the mixture, there was no satisfactory bonding attained.

Figure 6A:
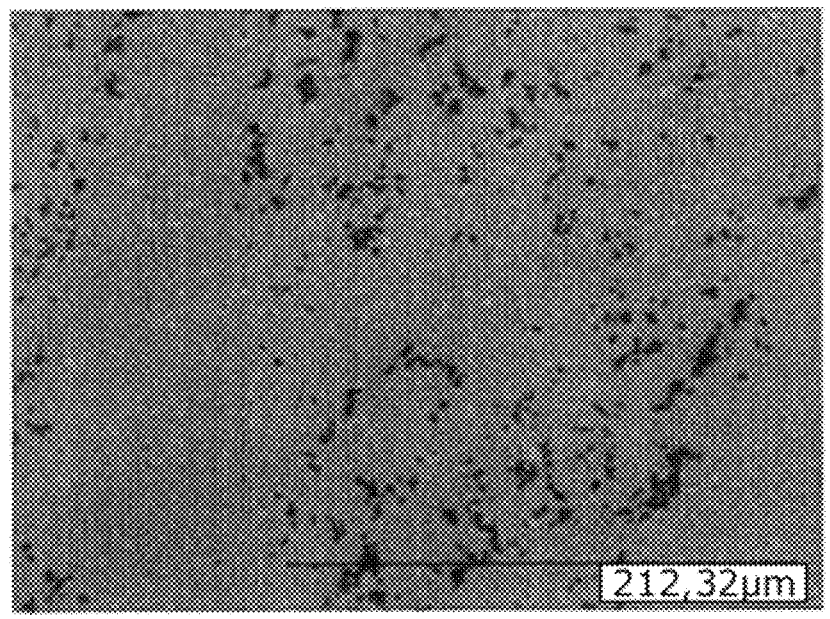
FIG. 6A shows an image of a surface of the silver oxide particles coated with organic compound (b), recorded with a light microscope.
Figure 6B:
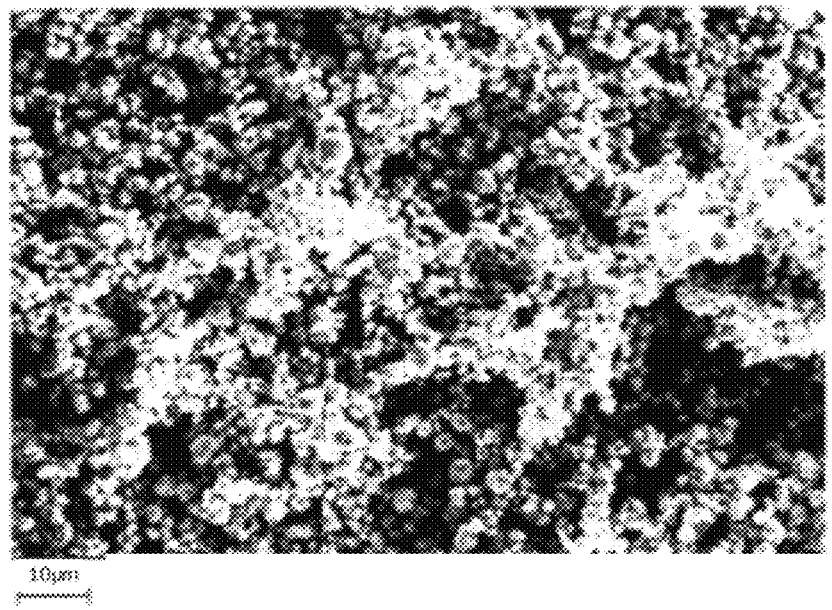
FIG. 6B shows an image of a surface of the silver oxide particles coated with organic compound (b), recorded with a scanning electron microscope.
Figure 6C:
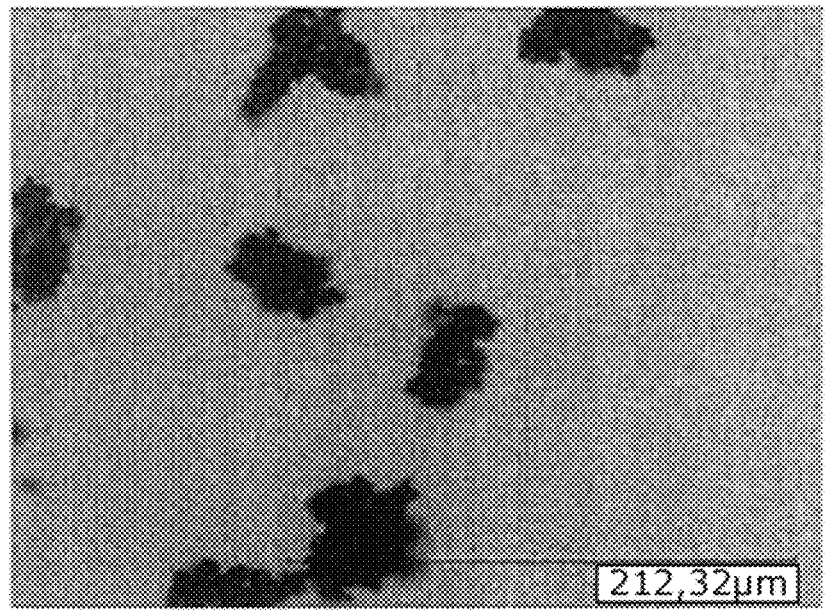
FIG. 6C shows an image of a surface of uncoated silver oxide particles, recorded with a light microscope.
Figure 6D:
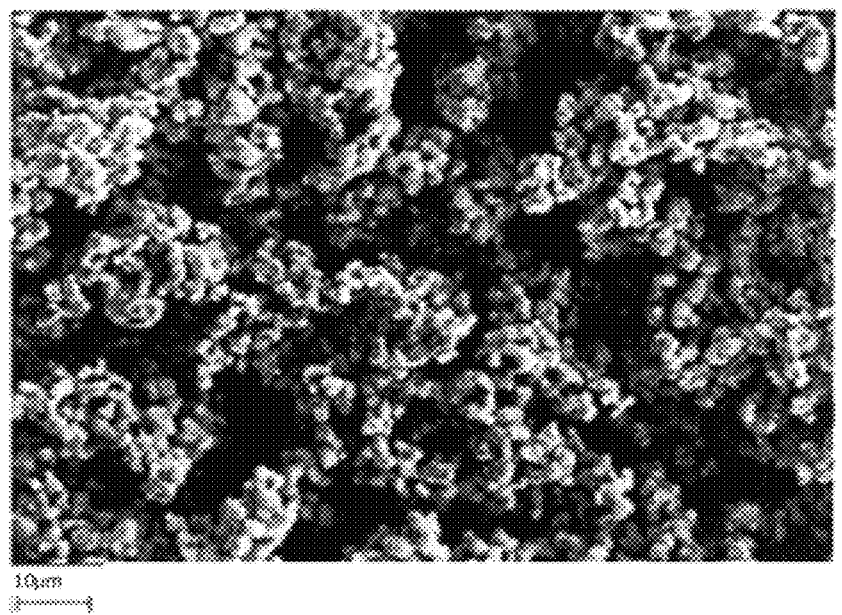
FIG. 6D shows an image of a surface of uncoated silver oxide particles, recorded with a scanning electron microscope.

FIGS. 6A-6B show images of a surface of the silver oxide particles coated with organic compound (b), while FIGS. 6C-6D show images of a surface of uncoated silver oxide particles. It is clearly evident that the silver oxide particles coated with organic compound (b) have a reduced tendency to agglomerate. The images in FIGS. 6A and 6C were recorded with a light microscope, whereas the images in FIGS. 6B and 6D were recorded with a scanning electron microscope. The resolution of the light micrographs is 1:500, whereas the resolution of the scanning electron micrographs is 1:1,000.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A method for connecting a component having a first surface to a substrate having a second surface, the method comprising:
 a) contacting the first surface of the component with the second surface of the substrate via by a mixture, such that the mixture is situated between the first surface of the component and the second surface of the substrate, in order to obtain a structure, and
 b) heating the structure to a temperature between 150° C. and 300° C.,
  wherein the mixture comprises (i) silver oxide particles; (ii) silver particles, the weight ratio of the silver particles to the silver oxide particles being at most 6 to 1; (iii) 0.05 to 2.0% by weight of an oxygen-containing polymer selected from the group consisting of methylcellulose, ethylcellulose, ethylmethylcellulose, carboxycellulose, hydroxypropylcellulose, hydroxyethylcellulose, hydroxymethylcellulose and mixtures thereof; and (iv) an organic compound represented by Formula I:

$$R^1\text{—}COR^2 \qquad (I),$$

wherein $R^1$ is an aliphatic residue having 8 to 32 carbon atoms, wherein $R^2$ is either —OM or comprises the moiety —X—$R^3$, wherein X is selected from the group consisting of O, S, N—$R^4$, wherein $R^4$ is a hydrogen atom or an aliphatic residue, wherein $R^3$ is a hydrogen atom or an aliphatic residue, and wherein M is a cation.

2. The method according to claim 1, wherein at least one of the first and second surfaces contains at least one metal selected from the group consisting of copper, nickel, gold, aluminum, and silver.

3. The method according to claim 2, wherein a fraction of a volume formed by a product of the at least one of the first and second surfaces and a depth of 1 μm accounted for by the at least one metal is at least 50% by weight relative to a total weight of metals in the volume.

4. The method according to claim 1, wherein at least one of the first and second surfaces comprises one or more metals selected from the group consisting of nickel and aluminum.

5. The method according to claim 1, wherein at least one of the first and second surfaces is fully or partly covered with a carbon-containing compound.

6. The method according to claim 5, wherein the carbon-containing compound is a polymer.

7. The method according to claim 1, wherein the mixture comprises 60% to 95% by weight of the silver oxide particles coated with the organic compound, and wherein the heating of the structure proceeds at a process pressure of 5 to 20 MPa.

8. The method according to claim 1, wherein the mixture comprises 10% to 30% by weight of the silver particles coated with the organic compound, and wherein the heating of the structure proceeds at a process pressure of 0 MPa to 3 MPa.

9. The method according to claim 1, wherein the structure is heated to a temperature between 200° C. and 250° C.

10. The method according to claim 1, wherein the organic compound is a $C_8$-$C_{30}$ fatty acid or a derivative thereof.

11. The method according to claim 1, wherein the silver oxide particles are coated with the organic compound and wherein an average primary particle size of the coated silver oxide particles is between 0.1 and 3.0 μm.

12. The method according to claim 1, wherein the mixture is a paste further comprising a dispersing agent.

13. The method according to claim 12, wherein the dispersing agent is selected from the group consisting of alpha-terpineol, beta-terpineol, gamma-terpineol, delta-terpineol, N-methyl-2-pyrrolidone, ethylene glycol, dimethylacetamide, 1-tridecanol, 2-tridecanol, 3-tridecanol, 4-tridecanol, 5-tridecanol, 6-tridecanol, isotridecanol, dibasic esters, glycerol, diethylene glycol, triethylene glycol and mixtures thereof.

14. The method according to claim 1, wherein a fraction of glass in the mixture is less than 2% by weight relative to a total weight of the mixture.

* * * * *